United States Patent
Parimi et al.

(10) Patent No.: US 12,191,115 B2
(45) Date of Patent: Jan. 7, 2025

(54) DUAL RF FOR CONTROLLABLE FILM DEPOSITION

(71) Applicant: Applied Materials, Inc., Santa Clara, CA (US)

(72) Inventors: Venkata Sharat Chandra Parimi, Sunnyvale, CA (US); Xiaoquan Min, Cupertino, CA (US); Zheng John Ye, Santa Clara, CA (US); Prashant Kumar Kulshreshtha, San Jose, CA (US); Vinay K Prabhakar, Cupertino, CA (US); Lu Xu, San Jose, CA (US); Kwangduk Douglas Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/694,062

(22) Filed: Nov. 25, 2019

(65) Prior Publication Data
US 2021/0159048 A1    May 27, 2021

(51) Int. Cl.
*C23C 16/458*    (2006.01)
*C23C 16/34*    (2006.01)
(Continued)

(52) U.S. Cl.
CPC ...... *H01J 37/32165* (2013.01); *C23C 16/345* (2013.01); *C23C 16/401* (2013.01);
(Continued)

(58) Field of Classification Search
None
See application file for complete search history.

(56) References Cited

U.S. PATENT DOCUMENTS

| 5,968,379 A | * | 10/1999 | Zhao | C23C 16/4586 |
| | | | | 219/121.52 |
| 6,024,044 A | * | 2/2000 | Law | H01J 37/32165 |
| | | | | 315/111.21 |

(Continued)

FOREIGN PATENT DOCUMENTS

| JP | 2013-143432 A | 7/2013 |
| TW | 2019-05957 A | 2/2019 |

(Continued)

OTHER PUBLICATIONS

International Search Report and Written Opinion mailed Mar. 22, 2021 in International Patent Application No. PCT/US2020/061462, 8 pages.

(Continued)

*Primary Examiner* — David P Turocy
(74) *Attorney, Agent, or Firm* — Kilpatrick Townsend & Stockton LLP

(57) ABSTRACT

A plasma processing system is described. The system may include a showerhead. The system may further include a first RF generator in electrical communication with the showerhead. The first RF generator may be configured to deliver a first voltage at a first frequency to the showerhead. Additionally, the system may include a second RF generator in electrical communication with a pedestal. The second RF generator may be configured to deliver a second voltage at a second frequency to the pedestal. The second frequency may be less than the first frequency. The system may also include a terminator in electrical communication with the showerhead. The terminator may provide a path to ground for the second voltage. Methods of depositing material using the plasma processing system are described. A method of seasoning a chamber by depositing silicon oxide and silicon nitride on the wall of the chamber is also described.

15 Claims, 6 Drawing Sheets

(51) Int. Cl.
*C23C 16/40* (2006.01)
*C23C 16/44* (2006.01)
*C23C 16/455* (2006.01)
*H01J 37/32* (2006.01)
*H01L 21/02* (2006.01)

(52) U.S. Cl.
CPC .... *C23C 16/4404* (2013.01); *C23C 16/45565* (2013.01); *H01J 37/32174* (2013.01); *H01J 37/32394* (2013.01); *H01J 37/32504* (2013.01); *H01L 21/02115* (2013.01); *H01L 21/02205* (2013.01); *H01L 21/02274* (2013.01); *H01J 2237/3321* (2013.01)

(56) References Cited

U.S. PATENT DOCUMENTS

| | | | | |
|---|---|---|---|---|
| 6,121,161 | A * | 9/2000 | Rossman | C23C 16/4401 438/783 |
| 6,483,690 | B1 * | 11/2002 | Nakajima | H01L 21/6833 361/234 |
| 7,323,401 | B2 * | 1/2008 | Ramaswamy | H01L 21/0337 427/523 |
| 2008/0277062 | A1 | 11/2008 | Koshimizu et al. | |
| 2012/0040536 | A1 * | 2/2012 | Furuta | C23C 16/4404 438/791 |
| 2014/0302256 | A1 * | 10/2014 | Chen | C23C 16/46 118/500 |
| 2016/0027614 | A1 | 1/2016 | Manna et al. | |
| 2018/0218902 | A1 * | 8/2018 | Venkatasubramanian | H01L 21/31111 |
| 2019/0035666 | A1 * | 1/2019 | Lim | H01L 21/6831 |
| 2019/0294050 | A1 | 9/2019 | Topping et al. | |

FOREIGN PATENT DOCUMENTS

| | | |
|---|---|---|
| WO | 2017-039875 A1 | 3/2017 |
| WO | 2019-169102 A1 | 9/2019 |

OTHER PUBLICATIONS

Application No. PCT/US2020/061462, International Preliminary Report on Patentability, Mailed On Jun. 9, 2022, 7 pages.

* cited by examiner

0 W LF Pedestal

500 W LF Pedestal

0 W LF Showerhead

500 W LF Showerhead

No Seasoning — 620

| | Carbon Hardmask | | |
|---|---|---|---|
| LF Pwr (W) | 0 | 150 | 300 |
| EdgeDrop Avg | 4.51% | 2.13% | 1.60% |

Oxide-Only Seasoning — 640

| | Carbon Hardmask | | |
|---|---|---|---|
| LF Pwr (W) | 0 | 150 | 300 |
| EdgeDrop Avg | 5.28% | 2.45% | 1.23% |

Oxide and Nitride Seasoning — 660

| | Carbon Hardmask | | |
|---|---|---|---|
| LF Pwr (W) | 0 | 150 | 300 |
| EdgeDrop Avg | 4.58% | 2.32% | 1.60% |

FIG. 6

DUAL RF FOR CONTROLLABLE FILM DEPOSITION

TECHNICAL FIELD

The present technology relates to semiconductor deposition processes. More specifically, the present technology relates to methods and systems of depositing films using both high frequency and low frequency RF power.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. For example, surface uniformity of masking materials may affect subsequent etching uniformity.

Thus, there is a need for improved systems and methods that can be used to produce high quality devices and structures. These and other needs are addressed by the present technology.

BRIEF SUMMARY

Applying low frequency (LF) radio frequency (RF) power along with high frequency (HF) RF power can improve the uniformity of deposited materials, particularly uniformity at the edge of a substrate. Introducing the LF RF at the bottom of the chamber (e.g., at the pedestal) may allow for smaller grain sizes and less roughness and may decrease the number of defects. Conditioning the chamber with dielectric layers (e.g., silicon oxide and silicon nitride) may decrease the number of defects on a substrate when the LF RF is introduced either at the bottom of the chamber or at the top of the chamber (e.g., at the showerhead).

Embodiments of the present technology may include a plasma processing system. The system may include a showerhead defining a plurality of apertures. The system may also include a pedestal configured to hold a substrate. The system may further include a first RF generator in electrical communication with the showerhead. The first RF generator may be configured to deliver a first voltage at a first frequency to the showerhead. Additionally, the system may include a second RF generator in electrical communication with the pedestal. The second RF generator may be configured to deliver a second voltage at a second frequency to the pedestal. The second frequency may be less than the first frequency. The system may also include a terminator in electrical communication with the showerhead. The terminator may be configured to have a first impedance at the first frequency. The terminator may be configured to have a second impedance at the second frequency. The first impedance may be greater than the second impedance. The terminator may provide a path to ground for the second voltage at the second frequency.

Embodiments of the present technology may include a method of depositing a material. The method may include delivering a mixture comprising a first precursor through a showerhead to a processing region of a semiconductor processing chamber. The method may also include applying a first voltage at a first frequency to the showerhead. The method may further include forming a plasma of the mixture within the processing region. Additionally, the method may include applying a second voltage at a second frequency to a pedestal while applying the first voltage at the first frequency to the showerhead. The second frequency may be less than the first frequency. The method may also include depositing the material on a substrate disposed on the pedestal, the material comprising elements from the mixture.

Embodiments of the present technology may include a method of depositing material. The method may include delivering a first mixture comprising a first silicon-containing precursor and an oxygen-containing precursor to a processing region of a semiconductor processing chamber. The method may also include forming a plasma of the first mixture within the processing region. The method may further include depositing a silicon oxide layer on a wall of the semiconductor processing chamber. Furthermore, the method may include delivering a second mixture comprising a second silicon-containing precursor and a nitrogen-containing precursor to the processing region. Also, the method may include forming a plasma of the second mixture within the processing region. The method may include depositing a silicon nitride layer on the wall of the semiconductor processing chamber. In addition, the method may include delivering a third mixture comprising a first precursor through a showerhead to the processing region. The method may further include applying a first voltage at a first frequency to the showerhead. The method may also include applying a second voltage at a second frequency to the semiconductor processing chamber. The second frequency may be less than the first frequency. The method may include forming a plasma of the third mixture within the processing region. Additionally, the method may include depositing a material on a substrate disposed on a pedestal in the processing region. The material may include elements from the third mixture.

BRIEF DESCRIPTION OF THE DRAWINGS

A further understanding of the nature and advantages of the disclosed technology may be realized by reference to the remaining portions of the specification and the drawings.

FIG. 6 shows tables of the uniformity profile of deposited hardmask layers according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Uniformity of deposited layers affects the yield of substrates. Layer uniformity at edges of substrates is often poor compared to the rest of the substrate. As a result, many devices near the edge of the substrate may not be functional. Increasing the yield of devices from a single substrate may decrease production costs and increase efficiency. Uniformity of deposited layers, particularly at the edge of the substrate, may be improved by applying a low frequency (LF) RF power simultaneously with a high frequency (HF) RF power. LF power may help activate ions and increase ion bombardment. LF power may result in improved coupling at the wafer edge so that small, localized plasmas do not form near the wafer edge. LF power may help deposit material into high aspect ratio features, which are more prevalent as characteristic dimensions decrease. However, applying LF power without HF power may not effectively dissociate precursors and may result in non-uniformities.

Applying both LF and HF power together may improve uniformity. However, applying LF power to the showerhead where high frequency (HF) power is applied may result in the hollow cathode effect within the apertures in the showerhead. This hollow cathode effect may result in sputtering of the showerhead and may increase defects with a deposited layer. Embodiments of the present technology may allow for a more uniform layer while decreasing defects over other technologies.

Defects may be reduced by introducing LF RF power to the pedestal instead of the showerhead. Applying LF RF to the pedestal instead of the showerhead may then avoid the hollow cathode effect as the pedestal does not have apertures. Defects may also be decreased by conditioning the walls of a chamber with layers of silicon oxide and silicon nitride. In addition, applying LF RF at the pedestal may increase the wafer surface bias to improve film properties, including grain size, surface roughness, uniformity, and etch selectivity. Applying LF to the showerhead would not result in the same bias effects.

Figure 1:
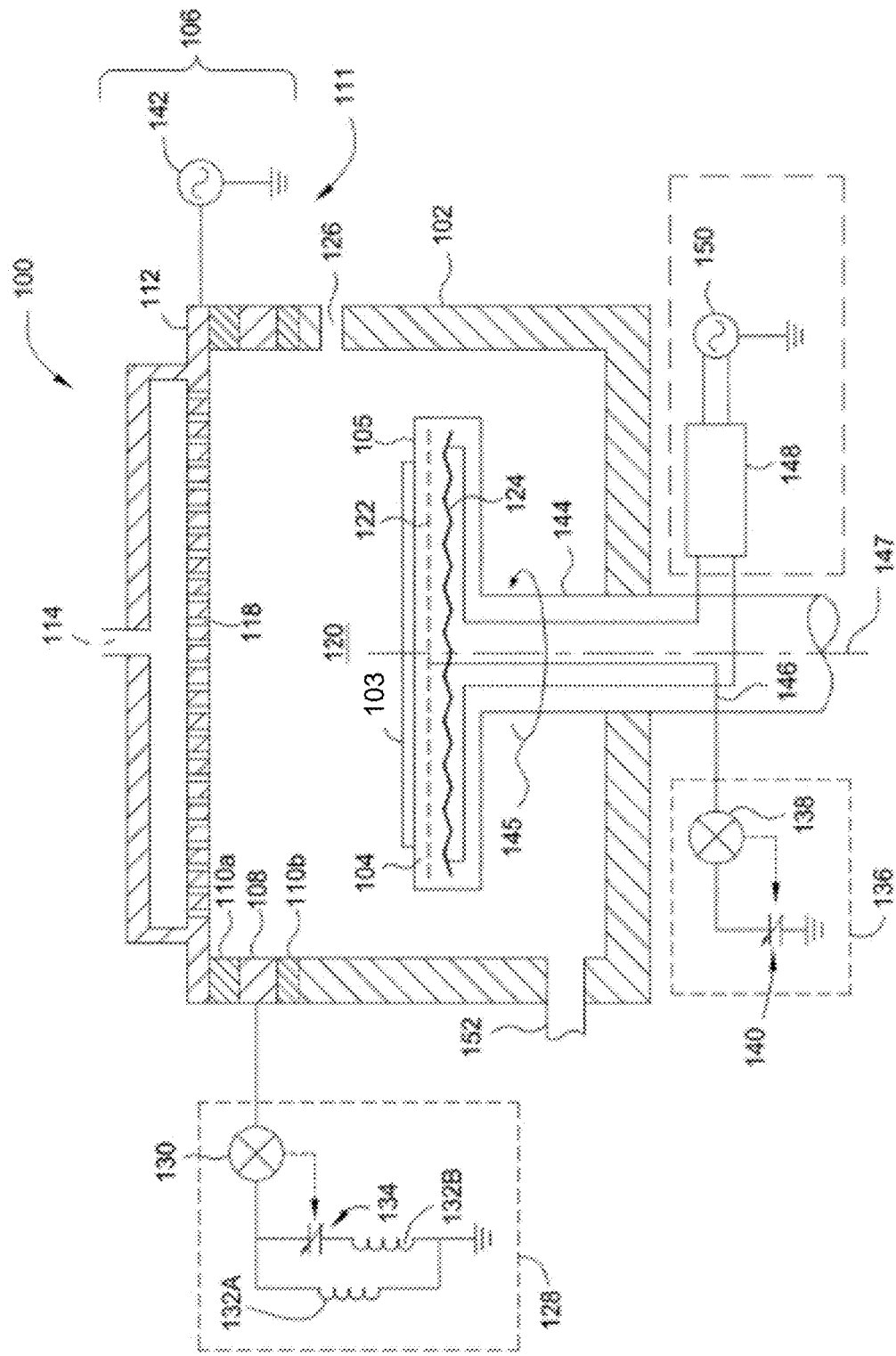
FIG. 1 shows a schematic cross-sectional view of an exemplary processing chamber according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode, heater, and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
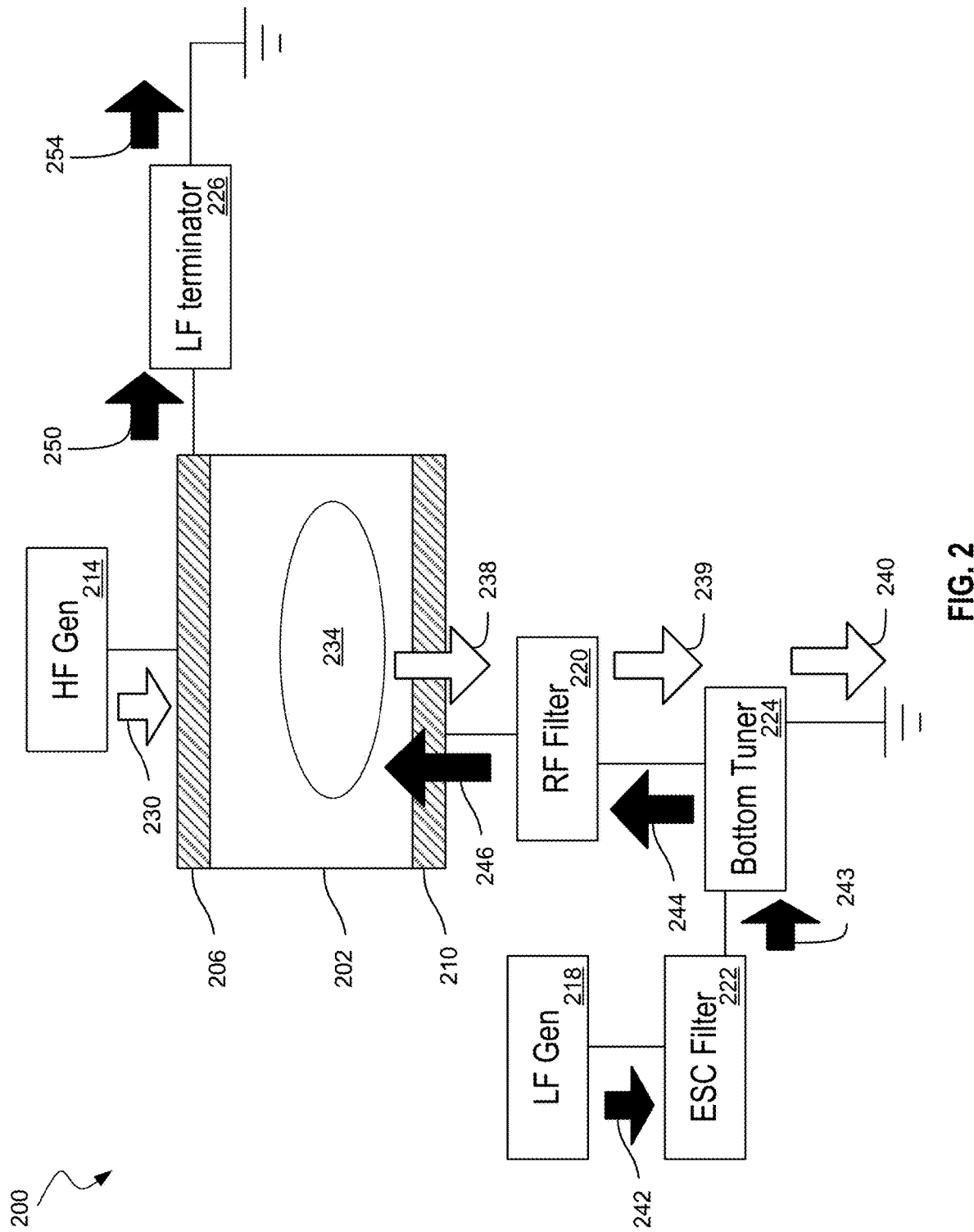
FIG. 2 shows an illustration of an exemplary plasma processing system according to some embodiments of the present technology.

FIG. 2 shows an illustration of an exemplary plasma processing system 200 according to some embodiments of the present technology. The figure may illustrate an overview of a system incorporating one or more aspects of the present technology, and/or which may perform one or more operations according to embodiments of the present technology. Additional details of system 200 or methods performed may be described further below. System 200 may allow for dual RF paths: one RF path for HF and a different RF path for LF. System 200 includes a chamber body 202. At two ends of chamber body 202 are first electrode 206 and second electrode 210. Components of system 200 may be used in combination with or as a substitute for components of processing chamber 100.

First electrode 206 may be a showerhead, gas inlet, or faceplate at the top of chamber body 202. For example, first electrode 206 may be gas distributor 112 in FIG. 1. System 200 may include a showerhead. First electrode 206, as an example, may be the showerhead defining a plurality of apertures. Each aperture of the plurality of apertures may have a conical shape. The wider end of the conical shape may be closer to second electrode 210.

System 200 may include a pedestal configured to hold a substrate. The pedestal may be an electrostatic chuck. As an example, system 200 may include a second electrode 210 that is within a pedestal at the bottom of chamber body 202. For example, second electrode 210 may be second electrode 122 within substrate support 104 in FIG. 1. Second electrode 210 may be electrically isolated from first electrode 206. The pedestal may include a heater, which may be third electrode 124.

System 200 may include a first RF generator in electrical communication with the showerhead. System 200 may be configured to strike a plasma by the first generator in a plasma processing region between the showerhead and the pedestal. The first RF generator may be configured to deliver a first voltage at a first frequency to the showerhead. For example, a high frequency (HF) generator 214 may be in electrical communication with first electrode 206. Electrical communication may refer to the components being electrically connected so that current may pass from one component to the other without going through a plasma discharge. HF generator 214 may be connected to first electrode 206 through a matching system and/or other electrical components. HF generator 214 may be first source of electric power 142.

System 200 may further include a second RF generator in electrical communication with the pedestal. The second RF generator may be configured to deliver a second voltage at a second frequency to the pedestal. The second frequency may be less than the first frequency. A low frequency (LF) generator 218 may be in electrical communication with second electrode 210. LF generator 218 may be a source of electrical power different from and/or in addition to second source of electric power 150. For example, source of electric power 150 may be a DC power or a power source to electrostatically hold the wafer. In some examples, system 200 may exclude a DC power source, other than a power source to electrostatically hold the wafer.

LF generator 218 may be in electrical communication with ESC filter 222, bottom tuner 224, and RF filter 220 As described later, in some cases, LF generator 218, although in electrical communication with a component, little or no power should pass through certain components (e.g., a filter configured to prevent LF power from passing).

System 200 may include a LF terminator 226 in electrical communication with the showerhead. LF terminator 226 is named as such because LF terminator 226 provides a path to ground for LF power (i.e., terminates LF power). As an example, LF terminator 226 may be in electrical communication with first electrode 206. LF terminator 226 may be configured to have first impedance at the first frequency. LF terminator 226 may be configured to have a second impedance at the second frequency. The first impedance may be greater than the second impedance. For example, the first impedance may be from 1,000 to 5,000 times greater, 5,000 to 10,000 times greater, or more than 10,000 times greater than the second impedance. The second impedance may be in a range from 0 to 1 Ω, 1 to 5 Ω, or 5 to 10 Ω.

In this manner, LF terminator 226 may be configured to provide a path to ground from the pedestal for the second voltage at the second frequency, and LF terminator 226 may be configured to be an open circuit and to not provide a path to ground from the showerhead for the first voltage at the first frequency. LF terminator 226 may include a capacitor and an inductor to achieve the path to ground for the second frequency and an open circuit for the second frequency. Other examples of LF terminator 226 may include components that resemble a low-pass filter, including an RC (resistor capacitor) filter, RL (resistor inductor) filter, and an RLC (resistor inductor capacitor) filter.

While LF terminator 226 may be configured to provide an open circuit for HF and a short for LF, achieving an ideal open circuit and an ideal short may be difficult. LF terminator 226 should be configured so that the impedance is a minimum at the second frequency and the impedance is a maximum at the first frequency. However, achieving the exact impedance may not be practical. The second frequency may have an impedance that is within 5%, 10%, or 15% of the minimum impedance, and the first frequency may have an impedance that is within 5%, 10%, or 15% of the maximum impedance. The minimum impedance may be in a range from 0 to 1 Ω, 1 to 5 Ω, or 5 to 10 Ω. The maximum impedance may be in a range from 5 to 7 kΩ, 7 to 10 kΩ, 10 to 15 kΩ, or greater than 15 kΩ. The effect of LF terminator 226 may to provide a much easier path to ground for LF than for HF. LF terminator 226 may be connected to first electrode 206 by an RF strap.

System 200 may include an RF filter 220. RF filter 220 may be filter 148, which may be in electrical communication with third electrode 124 disposed in the pedestal. RF filter 220 may be configured to have a third impedance at the first frequency and a fourth impedance at the second frequency. The fourth impedance may be greater than the third impedance. For example, the fourth impedance may be from 2 to 5 times greater, 5 to 10 times greater, 10 to 50 times greater, 50 to 100 times greater, 100 to 500 times greater, 500 times to 1,000 greater, or more than 1,000 times greater than the third impedance. The third impedance may be in a range from 0 to 1 Ω, 1 to 100 Ω, 100 to 500 Ω, or 500 Ω to 1,000 Ω. In this manner, RF filter 220 may be configured to provide an open circuit for LF and a short for HF. Providing the open circuit for LF may allow LF power to reach the showerhead through a plasma. For example, in FIG. 1, second electrode 122 may receive LF power, which should pass through to gas distributor 112. However, third electrode 124 is close to second electrode 122 and could provide a path for LF power. A high impedance at LF provided by filter 148 (e.g., RF filter 220) may prevent most or all LF power from going to third electrode 124. In systems where the LF is introduced at the showerhead, LF power going to third electrode 124 is not an issue as the LF power has already passed through the plasma before reaching either second electrode 122 or third electrode 124. RF filter 220 may be connected to second electrode 210 by an RF strap.

System 200 may include an electrostatic chuck (ESC) filter 222 in electrical communication with the second RF generator and the pedestal. For example, LF generator 218 may be in electrical communication with ESC filter 222. ESC filter 222 may be between LF generator 218 and bottom tuner 224 in an electrical circuit. Bottom tuner 224 may be second tuning circuit 136. ESC filter 222 may be configured to pass the second voltage at the second frequency to the pedestal. For example, ESC filter 222 may allow for LF voltage to pass through and reach second electrode 210 instead of going to electrical ground. ESC filter 222 may have an increased impedance by increasing the inductance of the filter. Increasing the impedance may reduce or eliminate reflected LF power and may allow for RF power to pass through to bottom tuner 224. ESC filter 222 may be in electrical communication with a power source for the ESC.

System 200 may include a first RF path from the first RF generator to the showerhead to the pedestal to ground. For example, the HF voltage may follow a path represented by white arrows. The HF voltage may follow a path represented by arrow 230 from HF generator 214 to first electrode 206. The HF voltage then passes through a plasma 234 to second electrode 210 and then to RF filter 220, with the path represented by arrow 238. The HF voltage may pass to bottom tuner 224, with the path represented by arrow 239. From bottom tuner 224, HF voltage may then pass to ground, with the path represented by arrow 240. Plasma 234 may by struck by the HF voltage from HF generator 214. The HF voltage may not go through LF terminator 226.

System 200 may include a second RF path from the second RF generator to the pedestal to ground. For example, the LF voltage may follow a path represented by black arrows. The LF voltage may follow a path represented by arrow 242 from LF generator 218 to ESC filter 222. The LF voltage may go from ESC filter 222 to bottom tuner 224, as shown with arrow 243. Then the LF voltage may go from bottom tuner 224 to RF filter 220, as represented by arrow 244. The LF voltage may continue on a path represented by arrow 246 to second electrode 210 and plasma 234. The LF voltage may then go through first electrode 206 and LF terminator 226 as represented by arrow 250. As shown by arrow 254, the LF voltage may then pass through LF terminator 226 and continue to electrical ground.

Figure 3:
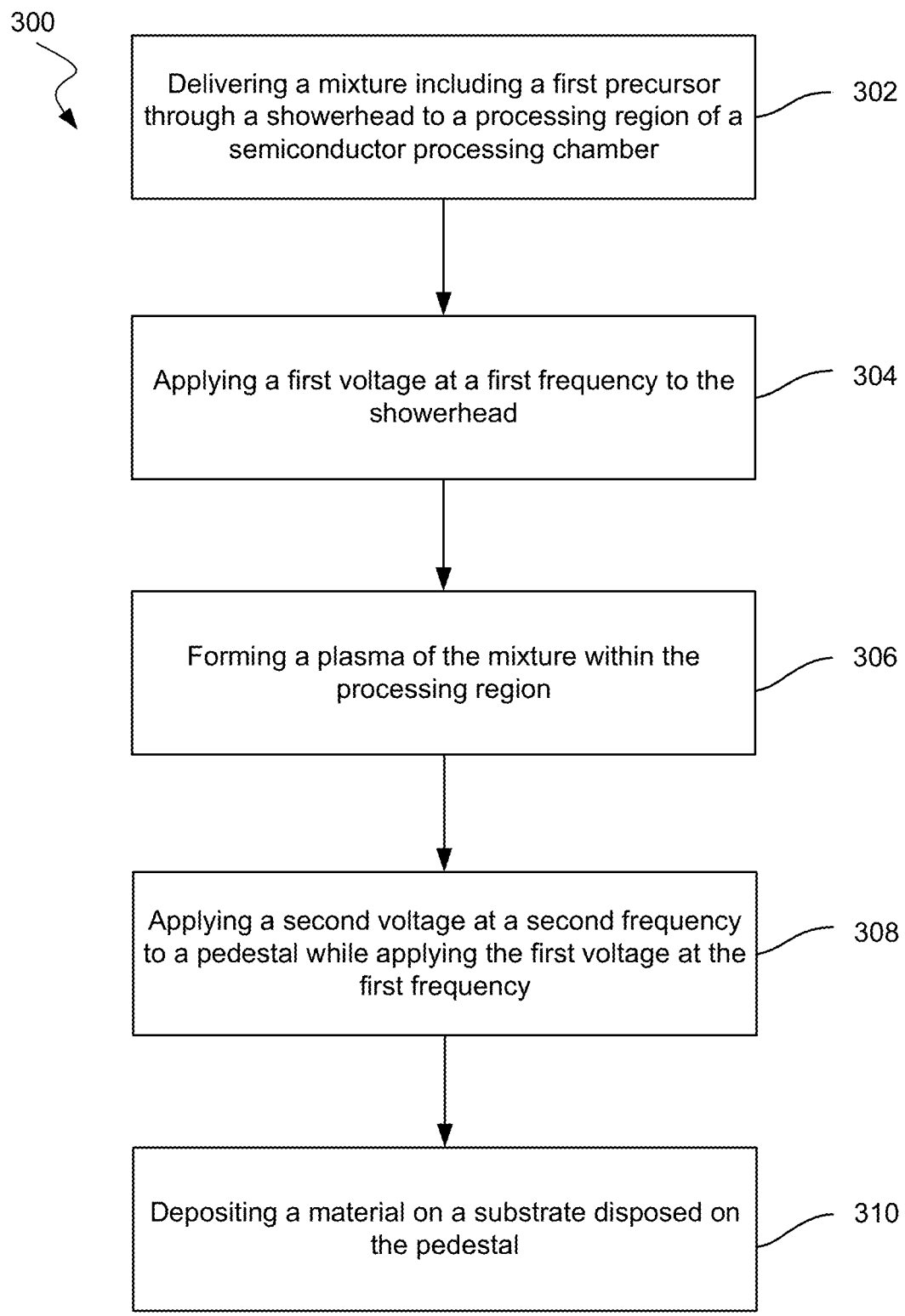
FIG. 3 shows a method of depositing material according to some embodiments of the present technology.

FIG. 3 shows a method 300 of depositing a material. Method 300 may involve applying a high frequency RF voltage to a showerhead and a low frequency RF voltage to a part other than a showerhead (e.g., a pedestal). Method 300 may use system 200.

At block 302, method 300 may include delivering a mixture including a first precursor through a showerhead to a processing region of a semiconductor processing chamber. The first precursor may include at least one of a tungsten-containing precursor or a carbon-containing precursor. The first precursor may include precursors with double bonds or precursors with triple bonds (e.g., nitrogen). As examples, the first precursor may include $B_2H_6$, TEOS (tetraethyl orthosilicate), or hydrogen ($H_2$). The mixture may include an inert gas, including argon, nitrogen, or helium.

In some embodiments, the mixture may include a second precursor. The first precursor may include a tungsten-containing precursor. The tungsten-containing precursor may include $WF_6$. The second precursor may include a carbon-containing precursor. The carbon-containing precursor may include $C_3H_6$ (propylene). The carbon-containing precursor may include any suitable hydrocarbon, including alkanes, alkenes, and alkynes. In some embodiments, the first precursor may be a tungsten-containing precursor and the second precursor may be a carbon-containing precursor. In some embodiments, the first precursor may be a boron-containing precursor, which may include $B_2H_6$ and the second precursor may be a carbon-containing precursor.

In some embodiments, the mixture may include a third precursor. The third precursor may include a boron-containing precursor, including any described herein. The first precursor may include a tungsten-containing precursor; the second precursor may include a carbon-containing precursor, and the third precursor may include a boron-containing precursor.

At block 304, method 300 may include applying a first voltage at a first frequency to the showerhead. The first frequency may be greater than or equal to 10 MHz, including 13.56 MHz, greater than 13 MHz, greater than 20 MHz, 27.12 MHz, or greater than 25 MHz. The first frequency may be considered high frequency.

At block 306, method 300 may include forming a plasma of the mixture within the processing region. For example, the plasma formed may be plasma 234 in FIG. 2.

At block 308, method 300 may include applying a second voltage at a second frequency to a pedestal while applying the first voltage at the first frequency to the showerhead. The second frequency may be less than the first frequency. The second frequency may be in a range from 100 kHz to 2 MHz, which may be considered low frequency. The second voltage may be applied at a power in a range of 50 W to 200 W, 200 to 300 W, 300 to 400 W, 400 to 500 W, 500 to 600 W, 600 to 700 W, 700 to 1000 W, or 1000 W to 1500 W. For example, the power may applied at 500 W.

In some embodiments, method 300 may include applying a negative DC voltage to the pedestal to electrostatically immobilize a substrate disposed on a pedestal. The negative DC voltage may be from −500 V to −1000 V or −1000 V to −1500 V. The substrate may be a semiconductor wafer, including a silicon wafer or a silicon-on-insulator (SOI) wafer.

At block 310, method 300 may include depositing the material on a substrate disposed on the pedestal. The material may include elements from the precursors in the mixture. For example, a material with tungsten and carbon (e.g., a WC layer) may be formed when the precursors include a tungsten-containing precursor and a carbon-containing precursor. A WC layer can be used as a hardmask for later patterning. The percentage of tungsten in the film can be tuned to a wide range, including from 5% to 95%. As another example, the material may include tungsten, boron, and carbon (e.g., a WBC layer) when the mixture includes a tungsten-containing precursor, a boron-containing precursor, and a carbon-containing precursor. As another example, the material with boron and carbon (e.g., a BC layer) may be formed when the precursors include a boron-containing precursor and a carbon-containing precursor. In some embodiments, the material may be an amorphous carbon hardmask layer when the mixture includes a carbon-containing precursor.

In some embodiments, the walls of a chamber body may be seasoned with silicon oxide and/or silicon nitride before depositing the material. Method 300 may include delivering a second mixture including a first silicon-containing precursor and an oxygen-containing precursor to the processing region. The first silicon-containing precursor may be any silicon-containing precursor described herein, including those described with FIG. 5. The oxygen-containing precursor may be any oxygen-containing precursor described herein, including those described with FIG. 5. Method 300 may further include forming a plasma of the second mixture within the processing region. The plasma may be formed with or without the second voltage applied to the pedestal. Method 300 may include depositing a silicon oxide layer on a wall of the semiconductor processing chamber.

Method 300 may also include delivering a third mixture. The third mixture may be delivered after the second mixture. The third mixture may include a second silicon-containing precursor and a nitrogen-containing precursor to the processing region. The second silicon-containing precursor may be any silicon-containing precursor described herein, including those described with FIG. 5. The nitrogen-containing precursor may be any nitrogen-containing precursor described herein, including those described with FIG. 5. A plasma of the third mixture may be formed within the processing region. The plasma may be formed with or without the second voltage applied to the pedestal. Method 300 may further include depositing a silicon nitride layer on the wall of the semiconductor processing chamber. The ratio of the thickness of the nitride layer to the thickness of the oxide layer on the wall may be in a range from 0.5 to 1.0, 0.8 to 1.2, 0.9 to 1.1, or 1.0 to 2.0. Method 300 may include placing the substrate on the pedestal after depositing the silicon nitride. Placing the substrate on the pedestal may be before forming a plasma of the first mixture at block 306.

Figure 4A:
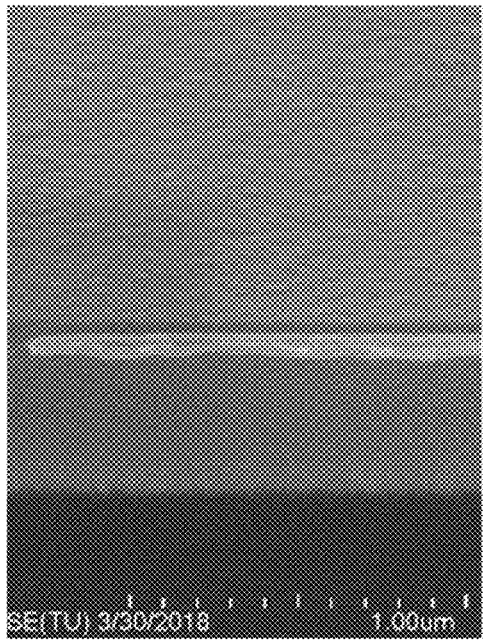
FIG. 4A, FIG. 4B, FIG. 4C, and FIG. 4D show scanning electron microscope (SEM) images of films deposited according to some embodiments of the present technology.
Figure 4B:
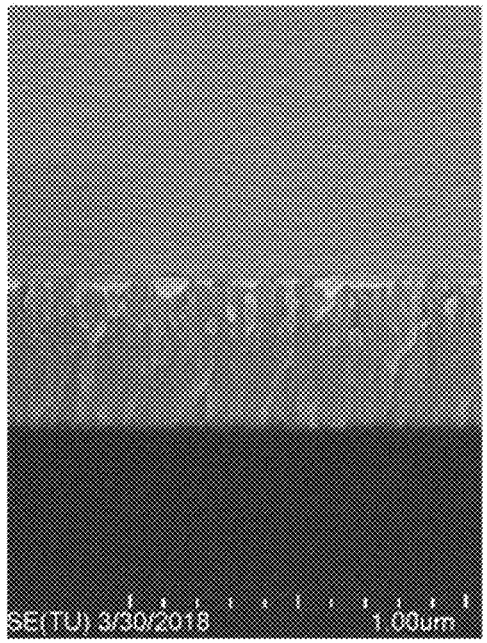
Figure 4C:
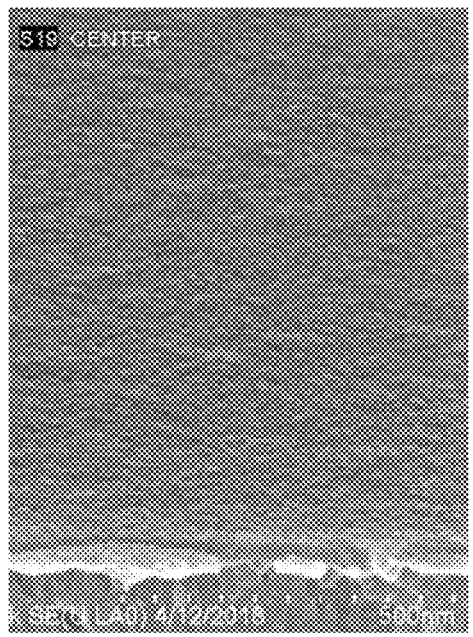
Figure 4D:
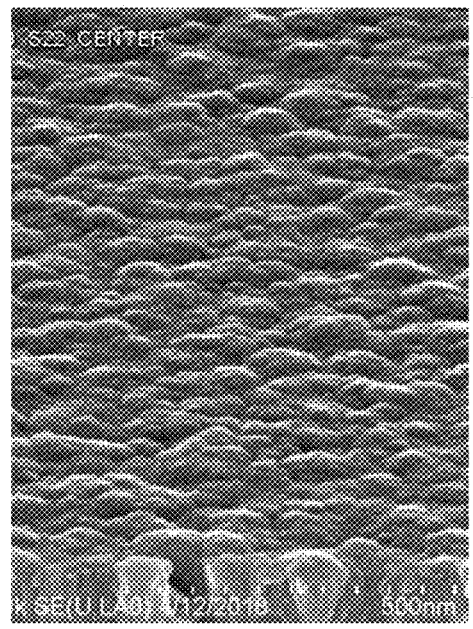

FIG. 4A, FIG. 4B, FIG. 4C, and FIG. 4D show scanning electron microscope (SEM) images of WBC films deposited. FIG. 4A and FIG. 4B are images from using low frequency at the pedestal with a system similar to system 200. FIG. 4A is an image with deposition at 0 W LF power, and FIG. 4B is an image with deposition at 500 W LF power. FIG. 4B does not show a discernible difference in grain size over FIG. 4A. FIG. 4C and FIG. 4D are images using low frequency at the showerhead. FIG. 4C is an image with deposition at 0 W LF power, and FIG. 4D is an image with deposition at 500 W LF power. The grain size in FIG. 4D is noticeably larger than the grain size in FIG. 4C. Furthermore, the surface of FIG. 4D is noticeably rougher than that in FIG. 4C. These figures show that having low frequency at the pedestal instead of the showerhead does not significantly increase the grain size of a deposited film. In addition, comparing 500 W LF power at the pedestal in FIG. 4B with 500 W LF power at the showerhead in FIG. 4D shows that the grain size is smaller when LF power is applied to the pedestal instead of the showerhead. Furthermore, FIG. 4B and FIG. 4D show that the surface roughness is less when the LF power is applied to the pedestal instead of the showerhead.

Using low frequency in addition to high frequency may improve uniformity of deposited materials on the substrate. However, using low frequency may also cause sputtering of surfaces in the chamber, including chamber walls. This sputtering may result in defects (e.g., particles, other adders) on the deposited material on the substrate. Depositing dielectric materials (e.g., silicon oxide, silicon nitride) may reduce the sputtering of the chamber and may reduce defects on the deposited material.

Figure 5:
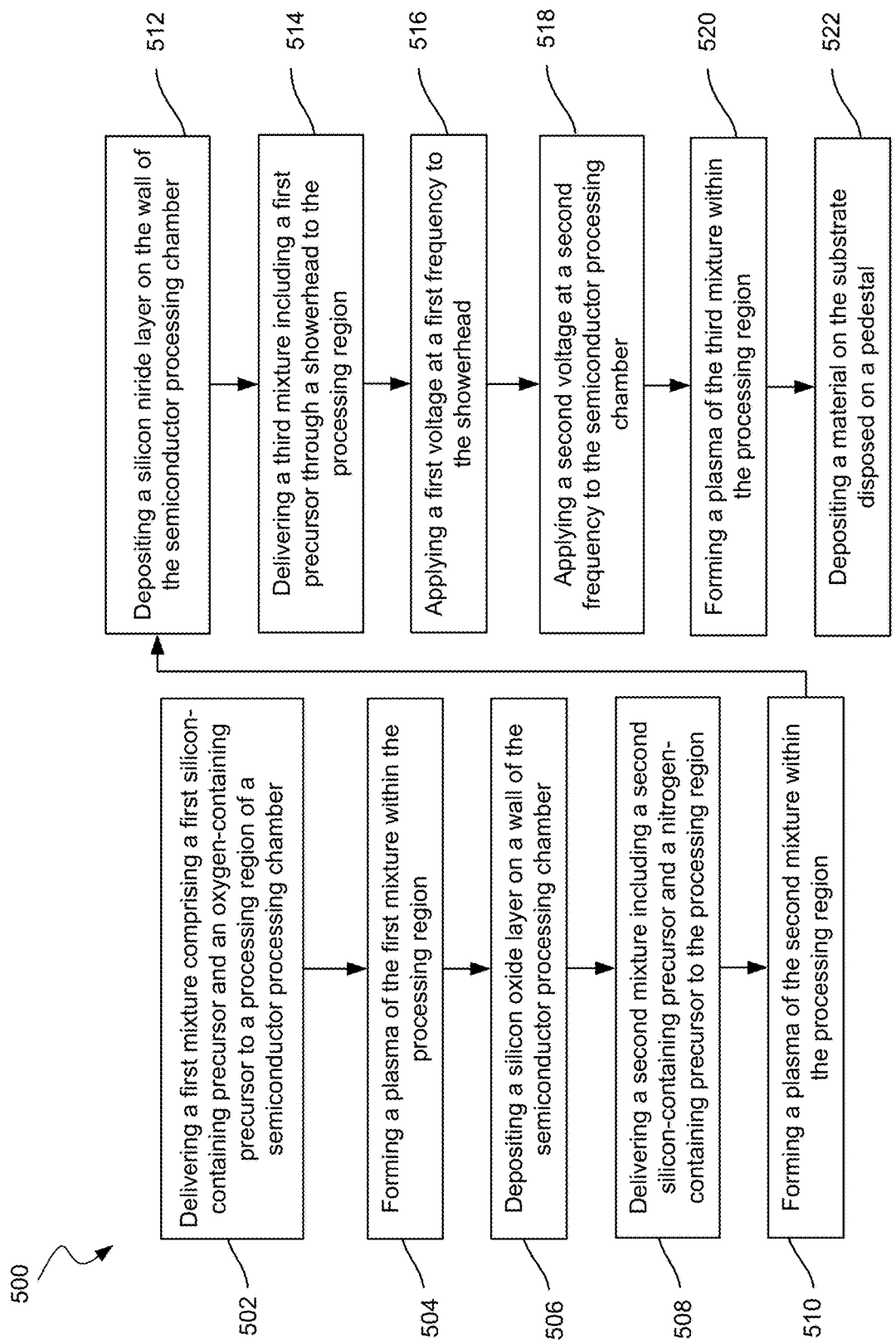
FIG. 5 shows a method of depositing material according to some embodiments of the present technology.

FIG. 5 shows a method 500 of depositing a material. The seasoning or conditioning of the chamber walls with silicon oxide and/or silicon nitride may or may not use system 200, where LF power is delivered to the pedestal. As an example, method 500 may use embodiments of chamber 100, where HF and LF may both be delivered to a showerhead.

At block 502, method 500 may include delivering a first mixture including a first silicon-containing precursor and an oxygen-containing precursor to a processing region of a semiconductor processing chamber. The first silicon-containing precursor may include silane ($SiH_4$), TEOS (tetraethyl orthosilicate), DCS ($SiH_2Cl_2$), or any silicon compound bonded to any combination of hydrogen atoms and/or halogen atoms (e.g., Cl, F). The oxygen-containing precursor may include $N_2O$, molecular oxygen ($O_2$), ozone, or water.

At block 506, method 500 may include depositing a silicon oxide layer on a wall of the semiconductor processing chamber. The silicon oxide layer may have a thickness of 100-4,000 nm.

At block 508, method 500 may include delivering a second mixture including a second silicon-containing precursor and a nitrogen-containing precursor to the processing region. The second silicon-containing precursor may be any silicon-containing precursor described herein. The nitrogen-containing precursor may include $NH_3$, $N_2$, or $NF_3$.

At block 510, method 500 may include forming a plasma of the second mixture within the processing region. The plasma formed may be any plasma described herein.

At block 512, method 500 may include depositing a silicon nitride layer on the wall of the semiconductor processing chamber. The silicon nitride layer may have a thickness of 50-2,000 nm. The silicon nitride layer may be deposited on a silicon oxide layer, which is deposited on the wall of the semiconductor processing chamber. The ratio of the thickness of the nitride layer to the thickness of the oxide layer on the wall may be in a range from 0.5 to 1.0, 0.8 to 1.2, 0.9 to 1.1, or 1.0 to 2.0.

At block 514, method 500 may include delivering a third mixture including a first precursor through a showerhead to the processing region. The first precursor may be a carbon-containing precursor. The carbon-containing precursor may be any carbon-containing precursor described herein.

In some embodiments, the first precursor may be a tungsten-containing precursor, which may be any described herein. The third mixture may further include a second precursor and a third precursor. The second precursor may be a boron-containing precursor which may be any described herein. The third precursor may be a carbon-containing precursor which may be any described herein.

Method 500 may include placing a substrate on a pedestal in the substrate processing region after depositing the silicon nitride layer. The substrate may be any substrate described herein. Method 500 may include electrostatically immobilizing the substrate with a negative DC voltage. The negative DC voltage may not be either the first voltage or the second voltage.

In some embodiments, the deposition of silicon oxide and/or silicon nitride may be part of conditioning a chamber before the chamber begins processing product substrates. The deposition of silicon oxide and silicon nitride may be cycled between the two layers. For example, a cycle of silicon oxide and silicon nitride may be repeated 2, 3, 4, 5, or more times. The deposition of silicon oxide and silicon nitride may or may not be repeated before every substrate or FOUP of wafers processed. In some embodiments, the deposition of silicon oxide and silicon nitride may be repeated between every 1, 2, 3, 4, 5, or 6 to 10 substrates or FOUPs.

At block 516, method 500 may include applying a first frequency to the showerhead. The first frequency may be any high frequency described herein. The showerhead may be any showerhead described herein.

At block 518, method 500 may include applying a second voltage at a second frequency to the semiconductor processing chamber. The second frequency may be lower than the first frequency. The second frequency may be any low frequency described herein.

The second voltage may be applied to the showerhead. Applying the second voltage to the showerhead may use chamber 100 of FIG. 1. For example, electric power 142 may represent two RF generators (e.g., an LF generator and an HF generator). In some embodiments, the second voltage may be applied to the pedestal, and applying the second voltage may use system 200 of FIG. 2. The second voltage may be applied at a power in a range of 50 to 1500 W, including 50 to 100 W, 100 to 200 W, 200 to 300 W, 300 to 400 W, 400 to 500 W, 500 to 600 W, 600 to 700 W, 700 to 1000 W, or 1000 to 1500 W. For example, the power may applied at 300 W.

At block 520, method 500 may include forming a plasma of the third mixture within the processing region. The processing region may be in the chamber, between the showerhead and the pedestal.

At block 522, method 500 may include depositing a material on a substrate disposed on a pedestal in the substrate processing region. The material may include elements (i.e., atomic elements) from the third mixture. The material may be amorphous carbon with the third mixture including a carbon-containing precursor. For example, the amorphous carbon material may serve as a carbon hardmask layer. The material may be a WC layer, when the third mixture includes a tungsten-containing precursor and a carbon-containing precursor. The material may be a WBC layer, when the third mixture includes a tungsten-containing precursor, a boron-containing precursor, and a carbon-containing precursor. The material may be a BC layer, when the third mixture includes a boron-containing precursor and a carbon-containing precursor. The WC/WBC/BC layer may be any WC/WBC/BC layer described herein.

The deposited material may result in fewer adders on the substrate than an otherwise identical method of depositing where the otherwise identical method excludes depositing the silicon oxide layer on the wall and excludes depositing the silicon nitride layer on the wall. The fewer adders may be reduced from areas randomly distributed across the substrate. For example, the reduction in adders may not be limited to only a percentage (e.g., less than 50%, 40%, 30%, 20%, 10%, 5%, or 1%) of the substrate.

The deposited material may have an improved uniformity profile, particularly at the edge of a wafer. For example, the average thickness range at a location within 15 mm of the edge of the substrate as a percentage relative to the thickness at the center of the substrate may be less than 3.0%, 2.0%, or 1.0%. The location may be within 135 mm to 148 mm, within 135 mm to 140 mm, within 140 mm to 145 mm, or within 145 mm to 148 mm from the center of the substrate.

FIG. 6 shows the uniformity profile of deposited carbon hardmask layers under different conditions. The tables show "edge drop," which is the thickness range of the film at x positions in the range from 135 to 148 mm as a percentage relative to the thickness at the center of the wafer. The edge drop value shown is the average of measurements from the left side of the wafer and the right side of the wafer.

Table 620 shows results without any oxide or nitride seasoning of the chamber. Table 640 shows results with oxide seasoning only of the chamber (no nitride seasoning). Table 660 shows results with both oxide and nitride seasoning. Each table shows results for no low frequency power, 150 W low frequency (300 kHz) power, and 300 W low frequency (300 kHz) power.

Table 620 show that when no seasoning of the chamber is used and when no low frequency is applied to the showerhead, the thickness range at the edge of the wafer is the largest for the different amounts of low frequency. Table 620 shows an average edge drop of 4.51% for no LF. Table 620 shows that 300 W LF has the smallest average edge drop at 1.60%. The film at 150 W LF had an average edge drop of 2.13%.

Table 640 show that when only an oxide seasoning is used and when no LF is applied to the showerhead, the thickness range at the edge of the wafer is the largest for the different amounts of low frequency. Table 640 shows an average edge drop of 5.28% for no LF. Table 640 shows that 300 W LF has the smallest average edge drop at 1.23%. The film at 150 W LF had an average edge drop of 2.45%.

Table 660 show that when an oxide and nitride seasoning is used and when no LF is applied to the showerhead, the thickness range at the edge of the wafer is the largest for the different amounts of low frequency. Table 650 shows an average edge drop of 4.58% for no LF. Table 640 shows that 300 W LF has the smallest average edge drop at 1.60%. The film at 150 W LF had an average edge drop of 2.32%.

FIG. 6 shows that across different seasoning recipes, 300 W low frequency had the smallest thickness range at the edge and the best uniformity. The absence of low frequency power had the largest thickness range at the edge. Experiments also showed that the number of adders onto the substrate generally increased with increasing low frequency power, given the same chamber seasoning. The oxide only seasoning decreased the number of adders at 150 W LF and 300 W LF compared to no seasoning. The oxide and nitride seasoning decreased the number of adders at 300 W LF compared to the oxide only seasoning.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of depositing material, the method comprising:
    delivering a first mixture comprising a first silicon-containing precursor and an oxygen-containing precursor to a processing region of a semiconductor processing chamber;
    forming a plasma of the first mixture within the processing region;
    depositing a silicon oxide layer on a wall of the semiconductor processing chamber; repeatedly forming alternating layers of silicon oxide and silicon nitride at least five or more times to form a seasoning layer on the wall of the semiconductor processing chamber;
    delivering a second mixture comprising a second silicon-containing precursor and a nitrogen-containing precursor to the processing region,
    forming a plasma of the second mixture within the processing region;
    depositing a silicon nitride layer on the wall of the semiconductor processing chamber;
    delivering a third mixture comprising a first precursor through a showerhead to the processing region;
    applying a first voltage at a first frequency to the showerhead;
    striking a plasma of the third mixture within the processing region using the first voltage at the first frequency from the showerhead;

applying a second voltage at a second frequency after striking the plasma and while applying the first voltage at the first frequency to the showerhead to the semiconductor processing chamber, the second frequency being less than the first frequency, wherein:
a low frequency terminator is electrically coupled with the showerhead and configured to form a ground path for the second voltage at the second frequency while forming an open circuit from the showerhead for the first voltage at the first frequency; and
an electrostatic chuck (ESC) filter receives the second voltage at the second frequency from an RF generator and passes the second voltage at the second frequency to a pedestal, and the ESC filter passes a DC chucking voltage from a power source for an ESC to the pedestal; and
depositing a material on a substrate disposed on a pedestal in the processing region, the material comprising elements from the third mixture.

2. The method of claim 1, wherein the second frequency is in a range from 100 kHz to 2 MHz.

3. The method of claim 1, wherein the first frequency is greater than or equal to 10 MHz.

4. The method of claim 1, further comprising placing the substrate on the pedestal in the processing region after depositing the silicon nitride layer.

5. The method of claim 1, wherein the second voltage is applied at a power in a range from 200 W to 500 W.

6. The method of claim 1, wherein:
the first precursor is a carbon-containing precursor, and the material is amorphous carbon.

7. The method of claim 1, wherein:
the third mixture further comprises a second precursor and a third precursor,
the first precursor is a tungsten-containing precursor,
the second precursor is a boron-containing precursor,
the third precursor is a carbon-containing precursor, and the material comprises tungsten, boron, and carbon.

8. The method of claim 1, wherein:
the first frequency is greater than or equal to 10 MHz, and
the second frequency is in a range from 100 kHz to 2 MHz.

9. The method of claim 1, wherein a ratio of a thickness of the silicon nitride layer to a thickness of the silicon oxide layer on the wall the semiconductor processing chamber is between 0.5 to 2.0.

10. The method of claim 1, wherein a ratio of a thickness of the silicon nitride layer to a thickness of the silicon oxide layer on the wall the semiconductor processing chamber is between 0.8 to 1.2.

11. The method of claim 1, wherein the first silicon-containing precursor comprises a silicon compound bonded to a combination of hydrogen atoms and/or halogen atoms.

12. The method of claim 1, wherein the nitrogen-containing precursor comprises $NH_3$, $N_2$, or $NF_3$.

13. The method of claim 1, wherein the silicon oxide layer has a thickness of between 100 nm and 4000 nm.

14. The method of claim 1, further comprising:
depositing the material on a plurality of substrates from a FOUP of substrates; and
depositing the silicon oxide layer and the silicon nitride layer on the wall of the semiconductor processing chamber after the plurality of substrates from each FOUP in a plurality of FOUPs are processed.

15. The method of claim 1, wherein an average thickness of the material within 15 mm of an edge of the substrate is within 1% of a thickness of the material at the center of the substrate as a result of applying the second voltage at the second frequency to the pedestal while applying the first voltage at the first frequency to the showerhead.

* * * * *